(12) United States Patent
Oyu

(10) Patent No.: US 8,659,096 B2
(45) Date of Patent: Feb. 25, 2014

(54) SEMICONDUCTOR DEVICE

(76) Inventor: Kiyonori Oyu, Tokyo (JP)

(*) Notice: Subject to any disclaimer, the term of this patent is extended or adjusted under 35 U.S.C. 154(b) by 124 days.

(21) Appl. No.: 13/337,954

(22) Filed: Dec. 27, 2011

(65) Prior Publication Data

US 2012/0199916 A1 Aug. 9, 2012

(30) Foreign Application Priority Data

Feb. 3, 2011 (JP) .................................. 2011-021805

(51) Int. Cl.
*H01L 27/088* (2006.01)

(52) U.S. Cl.
USPC .................... 257/401; 257/774; 257/E23.011; 257/E29.255

(58) Field of Classification Search
USPC ................................. 257/401, 774
See application file for complete search history.

(56) References Cited

U.S. PATENT DOCUMENTS

| | | | |
|---|---|---|---|
| 2005/0275048 A1* | 12/2005 | Farnworth et al. | 257/431 |
| 2009/0160050 A1* | 6/2009 | Miyakawa et al. | 257/737 |
| 2009/0321796 A1* | 12/2009 | Inohara | 257/288 |
| 2010/0032809 A1* | 2/2010 | Collins et al. | 257/621 |
| 2011/0084385 A1* | 4/2011 | Itaya et al. | 257/737 |
| 2011/0195572 A1* | 8/2011 | Uchiyama | 438/667 |
| 2011/0210302 A1* | 9/2011 | Tsukada et al. | 257/2 |
| 2011/0233667 A1* | 9/2011 | Tai et al. | 257/334 |
| 2011/0254169 A1* | 10/2011 | Lin | 257/774 |
| 2012/0126412 A1* | 5/2012 | Wang et al. | 257/773 |
| 2012/0161201 A1* | 6/2012 | Hsieh | 257/140 |

FOREIGN PATENT DOCUMENTS

| | | |
|---|---|---|
| JP | 2004-327941 | 11/2004 |
| JP | 2005-032875 | 2/2005 |
| JP | 2005-228854 | 8/2005 |
| JP | 2006-278646 | 10/2006 |
| JP | 2007-027639 | 2/2007 |
| JP | 2007-042872 | 2/2007 |
| JP | 2010-080802 | 4/2010 |

* cited by examiner

*Primary Examiner* — A. Sefer
(74) *Attorney, Agent, or Firm* — Young & Thompson

(57) ABSTRACT

A semiconductor device comprises a semiconductor substrate; an element-forming region that includes semiconductor elements formed on the semiconductor substrate; a buried electrode plug formed so as to penetrate through the semiconductor substrate; and a trench-type electrode that is buried in a trench within the semiconductor substrate positioned between the element-forming region and the buried electrode plug.

20 Claims, 18 Drawing Sheets

SEMICONDUCTOR DEVICE

This application is based upon and claims the benefit of priority from Japanese Patent Application No. 2011-21805 filed on Feb. 3, 2011, the disclosure of which is incorporated herein in its entirety by reference.

BACKGROUND OF THE INVENTION

1. Field of the Invention

The present invention relates to a semiconductor device.

2. Description of the Related Art

Conventionally, a semiconductor chip including buried electrode plugs has been manufactured in order to perform information propagation between stacked semiconductor chips. JP2010-80802A discloses a semiconductor chip in which the abovementioned buried electrode plugs are arranged in the periphery or in required parts thereof (FIG. 2). In such a semiconductor chip as described above, bumps are formed on upper and lower surfaces of each buried electrode plug. By connecting the bumps to like bumps arranged in another semiconductor chip, information propagation is performed between the semiconductor chips.

In general, polysilicon electrodes having the same mechanical properties as a semiconductor substrate (silicon substrate) or highly conductive metal electrodes are buried in holes for the buried electrode plugs. Sidewalls of trenches in which the electrodes are buried are covered with a material adapted for securing insulation between the electrodes and the semiconductor substrate and dissimilar to the material of the semiconductor substrate.

SUMMARY OF THE INVENTION

In one embodiment, there is provided a semiconductor device, comprising:
a semiconductor substrate;
an element-forming region including a semiconductor element formed on the semiconductor substrate;
a buried electrode plug formed so as to penetrate through the semiconductor substrate; and
a trench-type electrode buried in a trench within the semiconductor substrate positioned between the element-forming region and the buried electrode plug.

In another embodiment, there is provided a semiconductor device comprising a plurality of semiconductor chips,
wherein each semiconductor chip comprises:
a semiconductor substrate;
an element-forming region including a semiconductor element formed on the semiconductor substrate;
a buried electrode plug formed so as to penetrate through the semiconductor substrate; and
a trench-type electrode buried in a trench within the semiconductor substrate positioned between the element-forming region and the buried electrode plug,
wherein the semiconductor chips are connected to each other through the buried electrode plugs.

BRIEF DESCRIPTION OF THE DRAWINGS

The above features and advantages of the present invention will be more apparent from the following description of certain preferred embodiments taken in conjunction with the accompanying drawings, in which.

Figure 1:
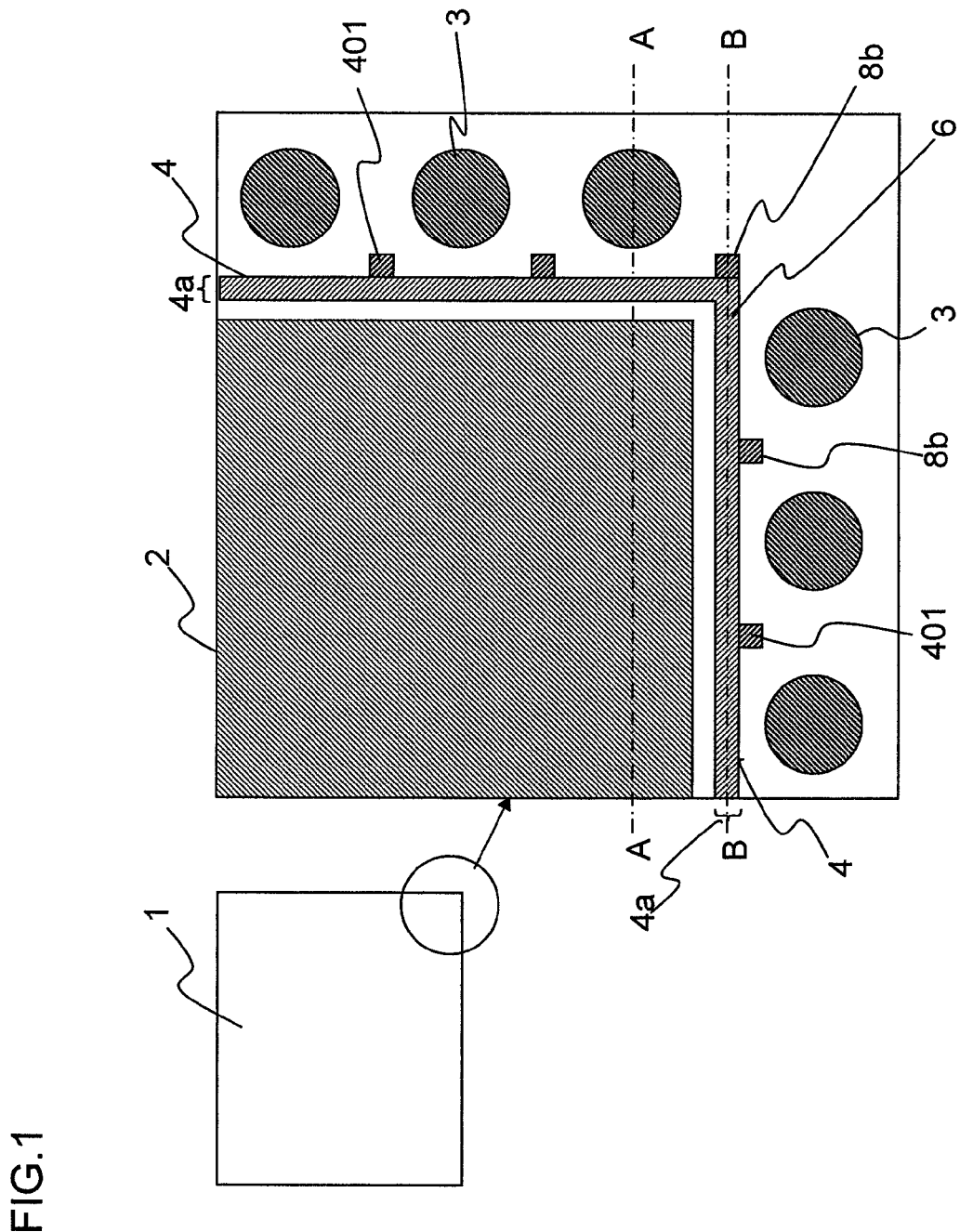
FIG. 1 is a plan view illustrating a semiconductor device according to a first exemplary embodiment.

In the drawings, reference numerals have the following meanings. 1: semiconductor substrate, 2: element-forming region, 3: buried electrode plug, 4: trench, 4a: first portion, 5, 7, 13, 14, 19: silicon oxide film, 6: trench-type electrode, 8a: trench for shallow-trench isolation region, 8b: second portion, 8c: shallow-trench isolation region, 9: contact plug, 10, 10a, 10b: hole for buried electrode plug, 11, 15, 16: silicon nitride film, 12: through-hole electrode, 20: gate insulating film, 21: gate electrode, 22: diffusion layer, 23: transistor, 25: interlayer insulating film, 25a: contact plug, 26a: wiring, 26b: electrode, 27: passivation film, 30: wiring, 401, 401a, 401b: contact-forming region, and 402: well layer.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

As illustrated in FIG. 1, the semiconductor device according to the first exemplary embodiment includes, in plan view, element-forming region 2, buried electrode plug 3 and a trench-type electrode 6. In the element-forming region 2, semiconductor elements are formed. The information propagation is performed among stacked semiconductor chips through buried electrode plug 3. The trench-type electrode 6 is buried in trench 4 provided between element-forming region 2 and buried electrode plug 3, so as to surround element-forming region 2. This trench 4 includes first portion 4a and second portions 8b. The first portion 4a is provided so as to surround element-forming region 2. The second portions 8b are in communication with an outer circumference of the first portion 4a and protrude from the outer circumference of the first portion 4a at a constant distance from each other. Each second portion 8b has the same depth as a shallow-trench isolation region formed in the element-forming region 2. As will be described later, second portions 8b are formed concurrently when the shallow-trench isolation region 8c is formed in the element-forming region 2. In addition, trench-type electrode 6 is formed continuously in first portion 4a and second portions 8b. Trench-type electrode 6 within each second portion 8b forms contact region 401. Contact region 401 is adapted to be provided with a predetermined potential through a contact plug (not illustrated).

Figure 2:
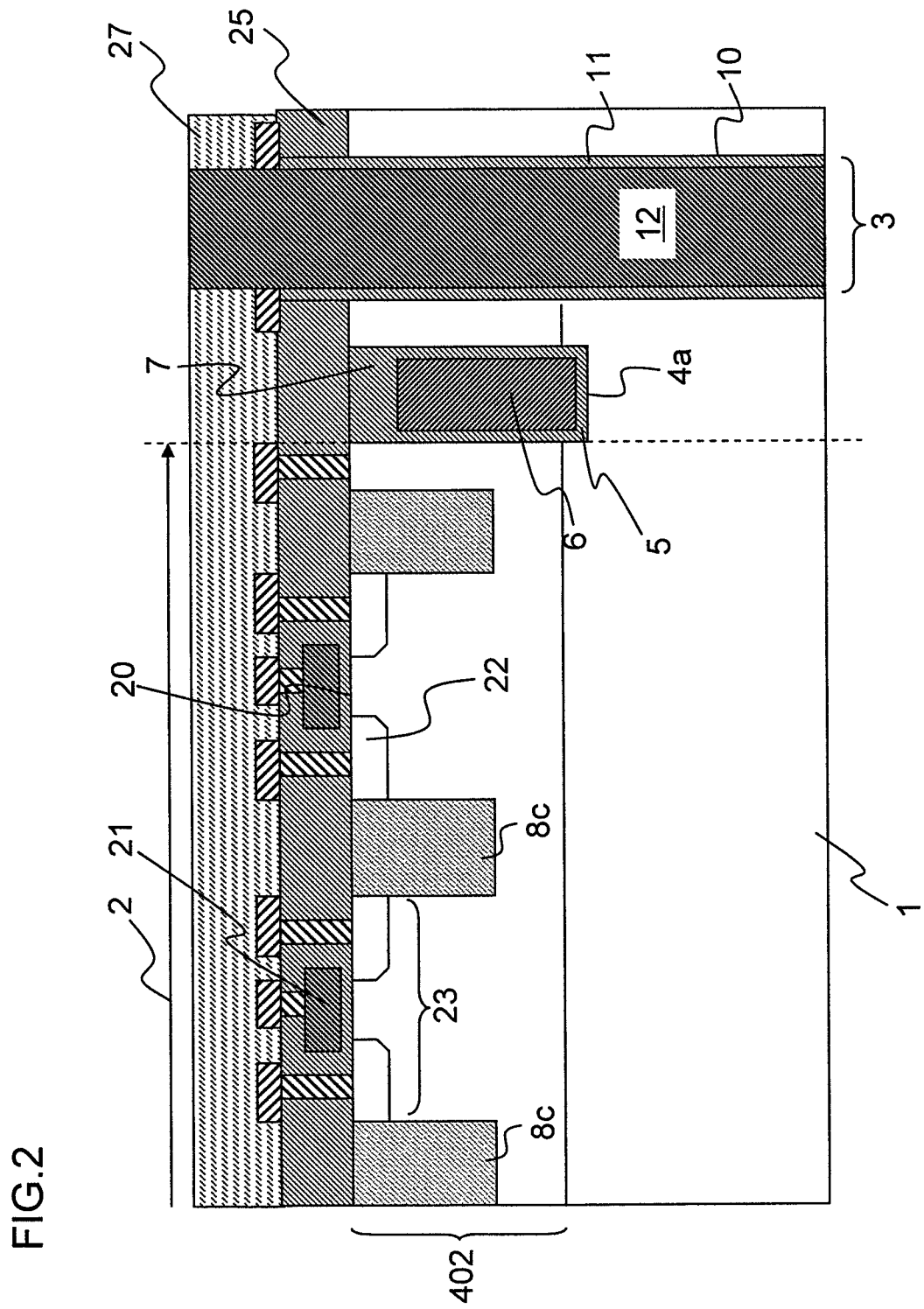
FIG. 2 is a cross-sectional view taken from the A-A direction of the semiconductor device illustrated in FIG. 1.
Figure 3:
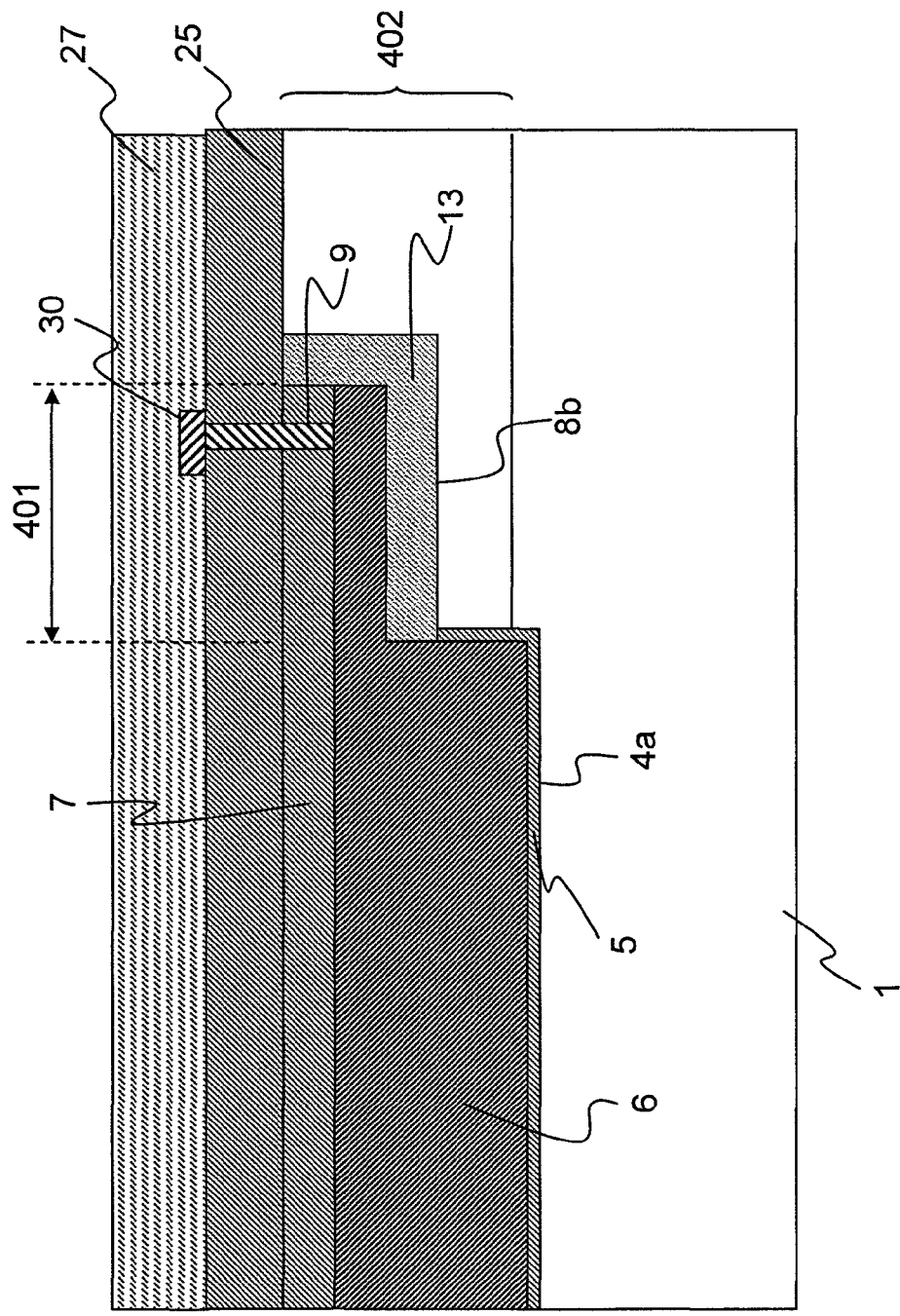
FIG. 3 is a cross-sectional view taken from the B-B direction of the semiconductor device illustrated in FIG. 1.

FIGS. 2 and 3 are schematic views representing cross-sections A-A and B-B of FIG. 1, respectively. As illustrated in FIGS. 2 and 3, trench 4 includes first portion 4a and second portions 8b.

First portion 4a is formed so as to have a depth greater than the depth of the shallow-trench isolation region 8c formed in element-forming region 2. Insulating film 5 is formed on the inner walls of first portion 4a and trench-type electrode 6 is buried on insulating film 5 in first portion 4a. In addition, insulating film 7 is formed on trench-type electrode 6 within first portion 4a, and trench-type electrode 6 within first portion 4a is surrounded by insulating films 5 and 7.

Each buried electrode plug 3 includes insulating film 11 formed on the sidewall of trench 10 and through-hole electrode (Through Silicon Via; TSV) 12 buried in trench 10. Buried electrode plug 3 is formed so as to penetrate through a semiconductor substrate 1.

Well layer 402 is provided in element-forming region 2. Transistors 23 are formed in the well layer 402. Transistors 23 and the like are provided in element-forming region 2. Transistors 23 comprise source and drain regions 22, gate electrode 21, and gate insulating film 20. Adjacent transistors 23 are isolated by shallow trench isolation region 8c. Interlayer insulating film 25 and passivation film 27 are formed on the semiconductor substrate 1 in this order.

As illustrated in FIG. 3, each second portion 8b of trench 4 extends outwardly from the outer circumference of first portion 4a. Insulating film 13 is formed on the inner walls of second portion 8b, and trench-type electrode 6 formed continuously from within first portion 4a is buried on insulating film 13 in the second portion 8b. Trench-type electrode 6 within second portion 8b is formed so as to have a shallower depth than trench-type electrode 6 within first portion 4a, and forms contact region 401. Insulating film 7 is further formed on trench-type electrode 6 within second portion 8b, and trench-type electrode 6 within second portion 8b is surrounded by insulating films 13 and 7. Wiring 30 is connected to trench-type electrode 6 positioned in second portion 8b with contact plug 9 interposed between wiring 30 and trench-type electrode 6. Contact plug 9 may be provided so as to be connected to trench-type electrode 6 positioned in first portion 4a.

Next, a method for manufacturing a semiconductor device according to the first exemplary embodiment will be described with reference to FIGS. 4 to 13. A drawing on the left side of each figure represents a cross-sectional view corresponding to FIG. 2, and a drawing on the right side of each figure represents a cross-sectional view corresponding to FIG. 3.

Figure 4:
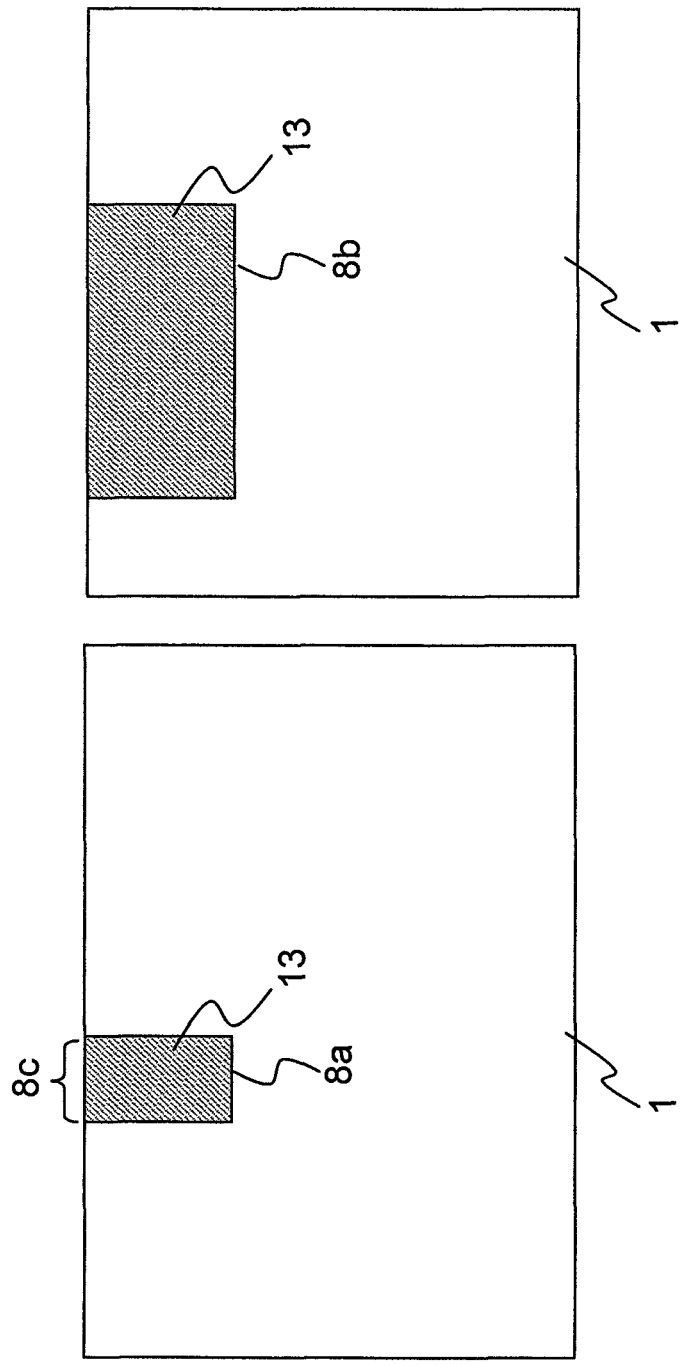
FIG. 4 is a cross-sectional view illustrating one step of a method for manufacturing the semiconductor device according to the first exemplary embodiment.

First, as illustrated in FIG. 4, trench 8a for a shallow-trench isolation region 8c and second portion 8b of trench 4 are simultaneously formed in an element-forming region 2 of semiconductor substrate (silicon substrate) 1 by using an STI formation method. Silicon oxide 13 is buried in these trenches 8a and 8b. At this time, shallow-trench isolation region 8c is formed in trench 8a. As will be described later, a transistor 23 is formed in a region within the semiconductor substrate 1 defined by shallow-trench isolation region 8c. The depth of shallow-trench isolation region 8c is set to 250 nm. A material buried in trenches 8a and 8b is not limited to a silicon oxide, but may be another insulator. Thereafter, well layer 402 (not illustrated in FIG. 4 and subsequent figures) having a desired conductivity type is formed in a portion of semiconductor substrate 1 from a surface thereof to 500 nm depth.

Figure 5:
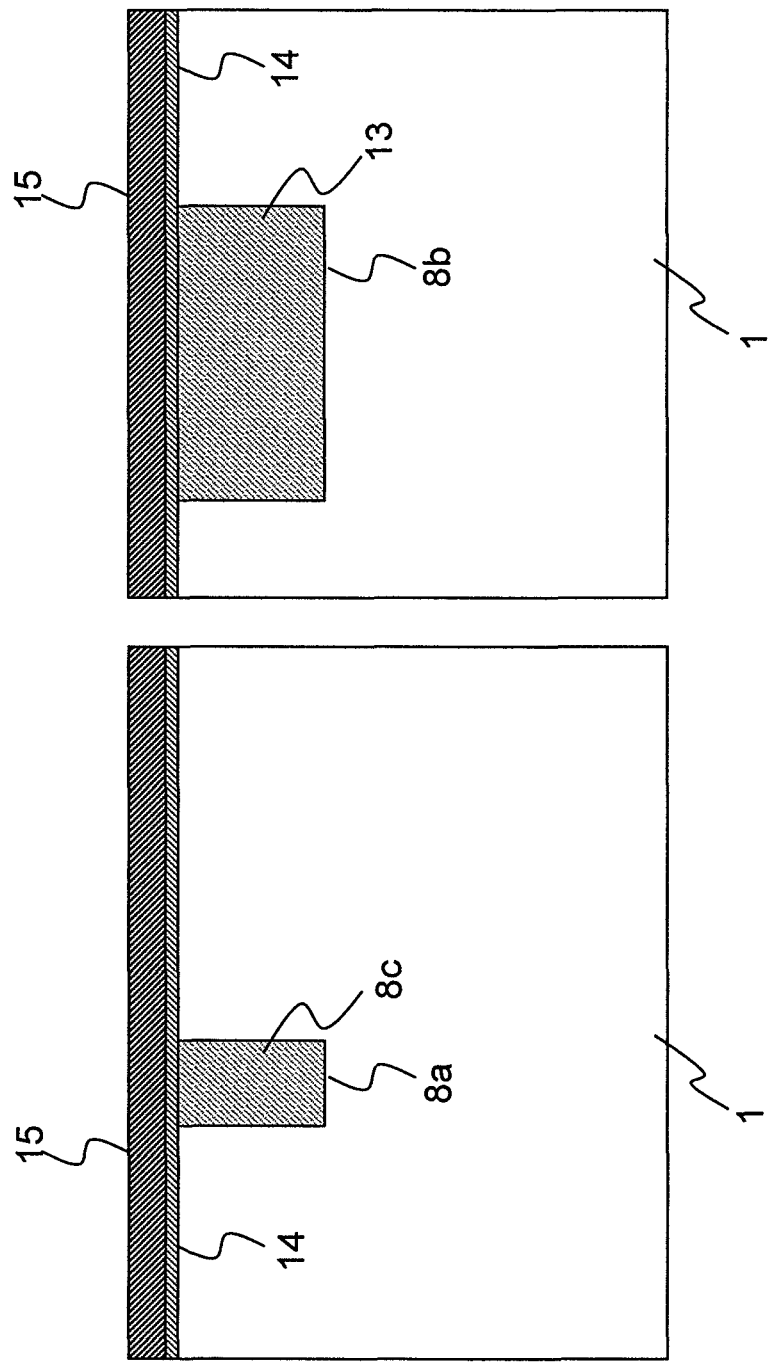
FIG. 5 is a cross-sectional view illustrating one step of a method for manufacturing the semiconductor device according to the first exemplary embodiment.

Next, as illustrated in FIG. 5, silicon oxide film 14 having a thickness of 10 nm is formed on the surface of silicon substrate 1. Then, silicon nitride film 15 having a thickness of 50 nm is formed on silicon oxide film 14.

Figure 6:
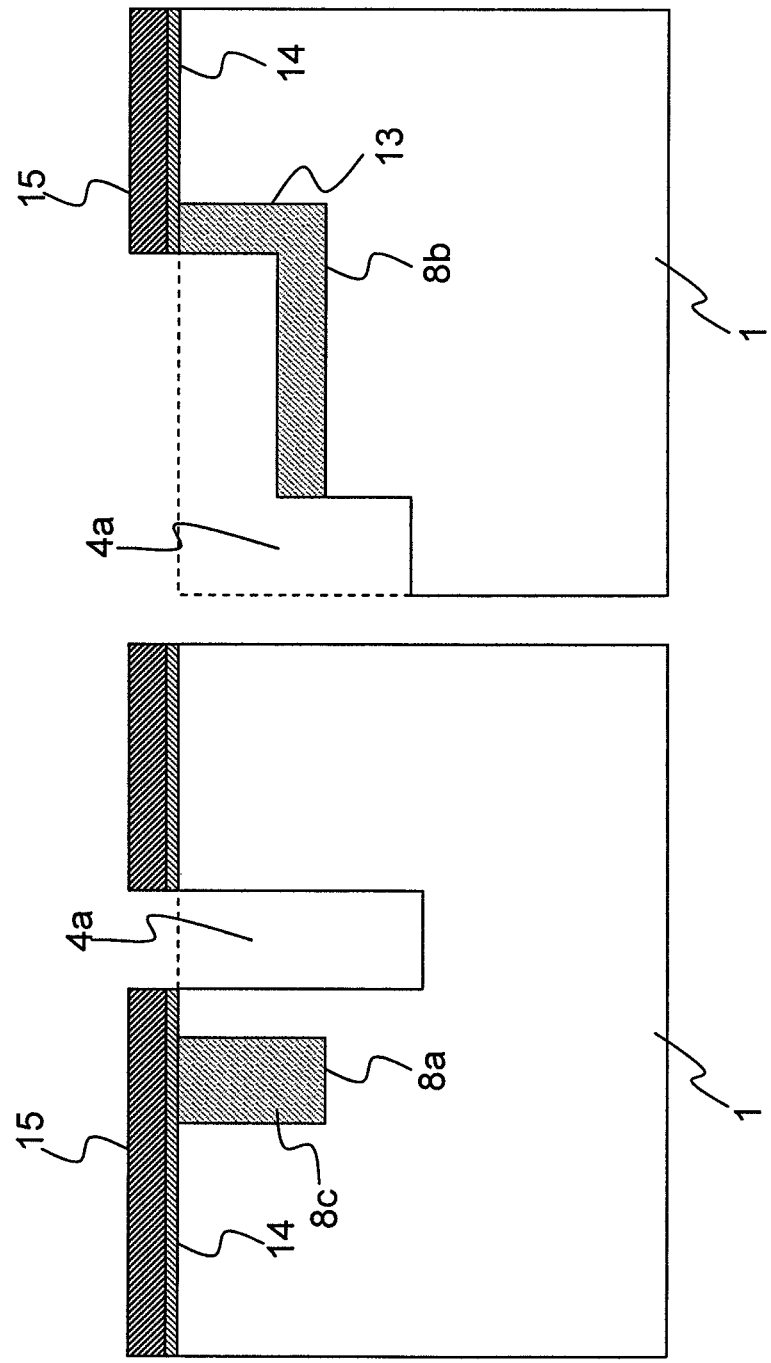
FIG. 6 is a cross-sectional view illustrating one step of a method for manufacturing the semiconductor device according to the first exemplary embodiment.

Thereafter, as illustrated in FIG. 6, first, silicon nitride film 15 and silicon oxide film 14 are processed using a usual lithography technique and dry-etching technique. Then, silicon oxide 13 buried in second portion 8b is etched by 150 nm. Silicon substrate 1 is etched by 600 nm, so as to be communicated with second portion 8b, thereby forming first portion 4a of trench 4. The opening width of this first portion 4a of trench 4 is set to 150 nm.

Figure 7:
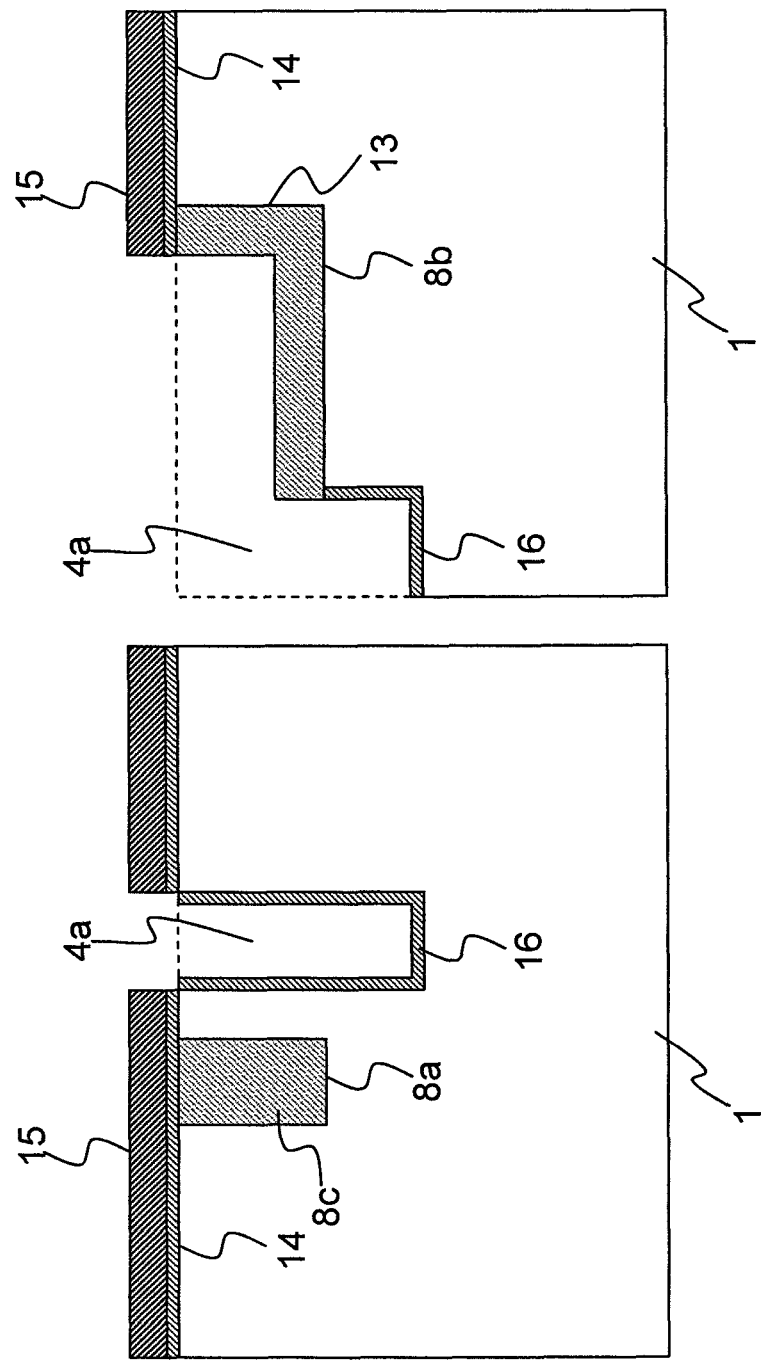
FIG. 7 is a cross-sectional view illustrating one step of a method for manufacturing the semiconductor device according to the first exemplary embodiment.

Next, as illustrated in FIG. 7, exposed surfaces of the inner walls of first portion 4a of trench 4 are thermally oxidized to form silicon oxide film 16 having a thickness of 10 nm.

Figure 8:
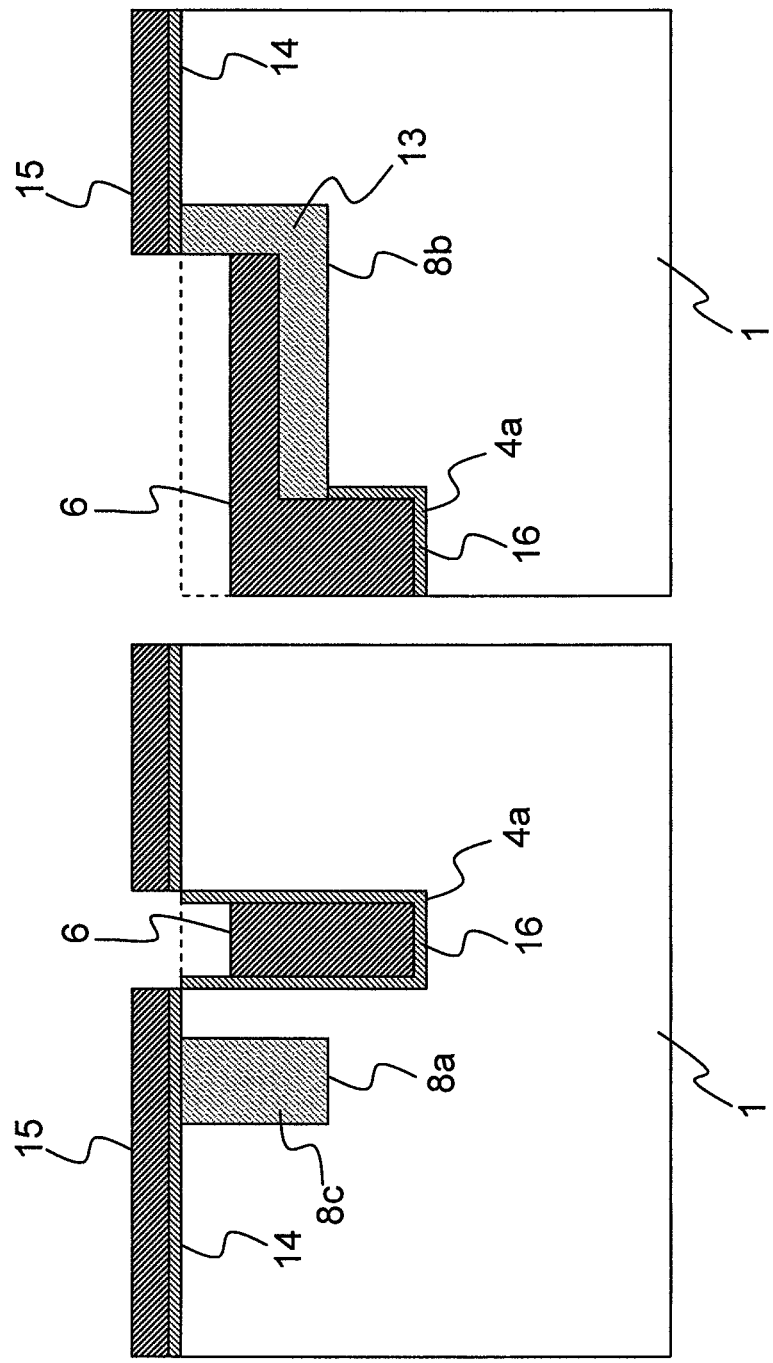
FIG. 8 is a cross-sectional view illustrating one step of a method for manufacturing the semiconductor device according to the first exemplary embodiment.

Next, as illustrated in FIG. 8, a titanium nitride film having a thickness of 10 nm and a tungsten film having a thickness of 200 nm are sequentially deposited on the entire surface of semiconductor substrate 1. Thereafter, the titanium nitride film and the tungsten film are recessed by etch-back to form trench-type electrode 6 in first and second portions 4a and 8b of trench 4. At this time, silicon oxide film 16 is hardly etched within trench 4 due to a difference in etching rate. However, a portion of trench-type electrode 6 positioned on an upper part of trench 4 is removed. Thus, an upper surface of trench-type electrode 6 is recessed down to a depth of approximately 50 nm from the surface of semiconductor substrate 1.

Figure 9:
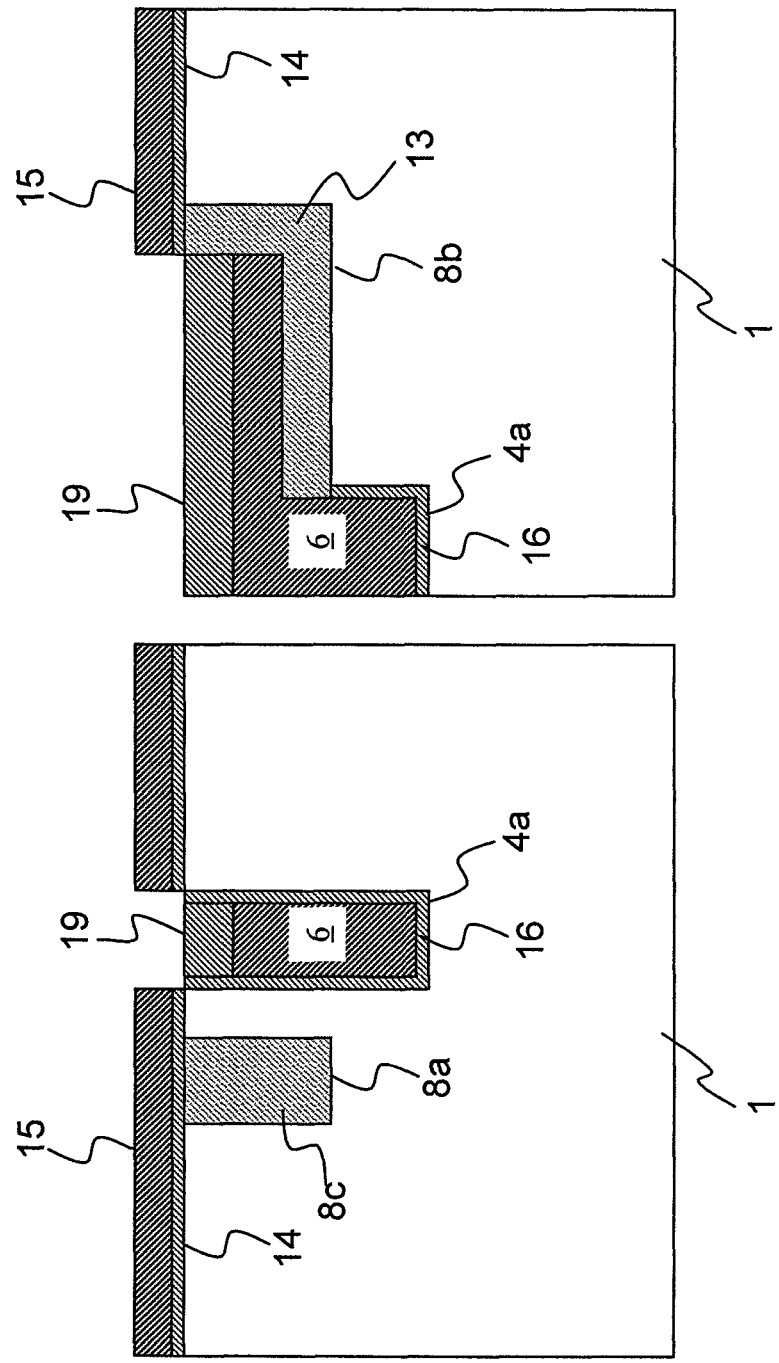
FIG. 9 is a cross-sectional view illustrating one step of a method for manufacturing the semiconductor device according to the first exemplary embodiment.

Next, as illustrated in FIG. 9, silicon oxide film having a thickness of 200 nm is deposited on the entire surface of semiconductor substrate 1. Thereafter, silicon oxide 19 is buried in upper parts of first and second portions 4a and 8b of trench 4 by etch-back.

Figure 10:
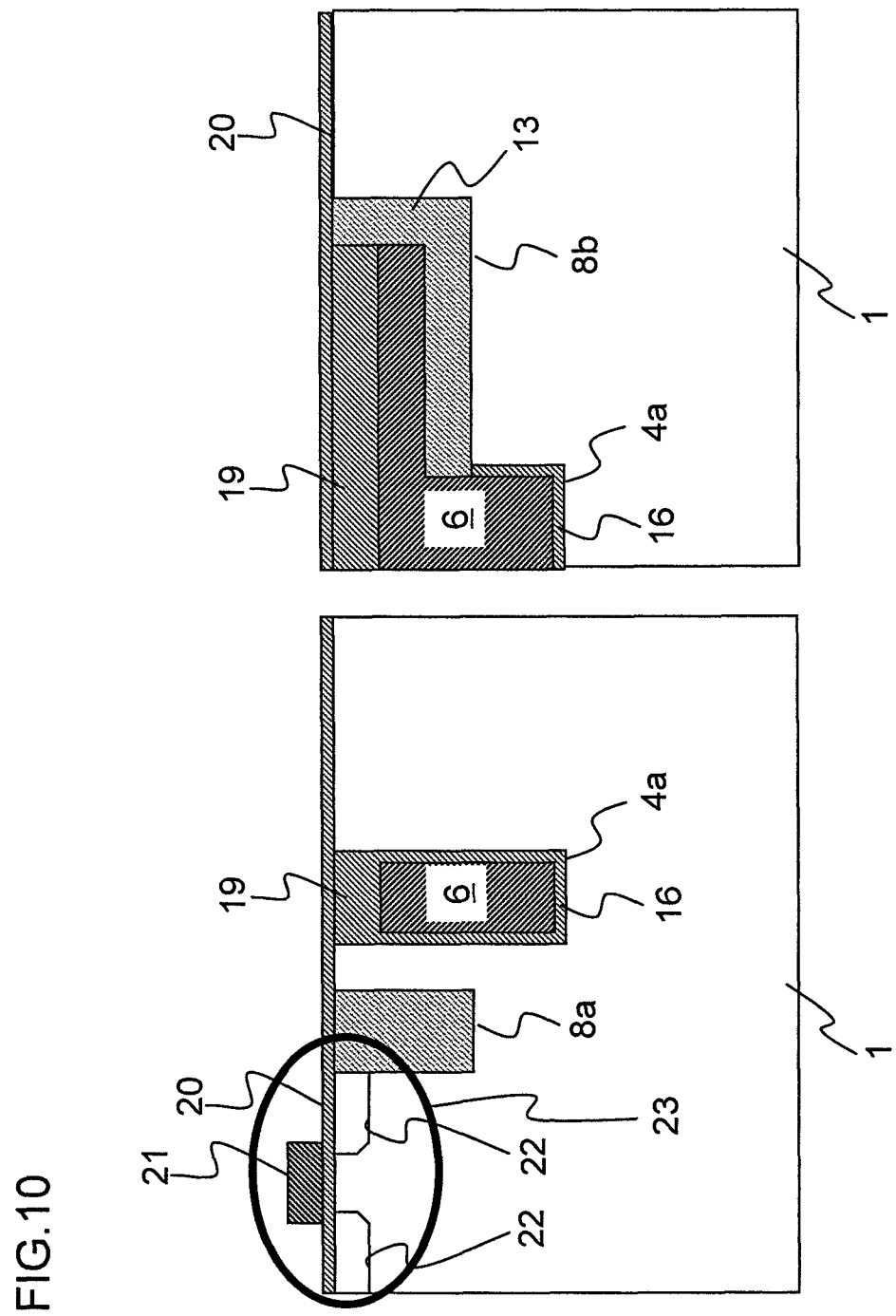
FIG. 10 is a cross-sectional view illustrating one step of a method for manufacturing the semiconductor device according to the first exemplary embodiment.

Next, as illustrated in FIG. 10, silicon nitride film 15 and silicon oxide film 14 are removed. Then, gate insulating film 20 having a thickness of 5 nm is deposited by a CVD method or the like. Thereafter, gate electrode 21 is formed on gate insulating film 20 and diffusion layer 22 is formed in semiconductor substrate 1, thereby manufacturing MOS transistor 23.

Figure 11:
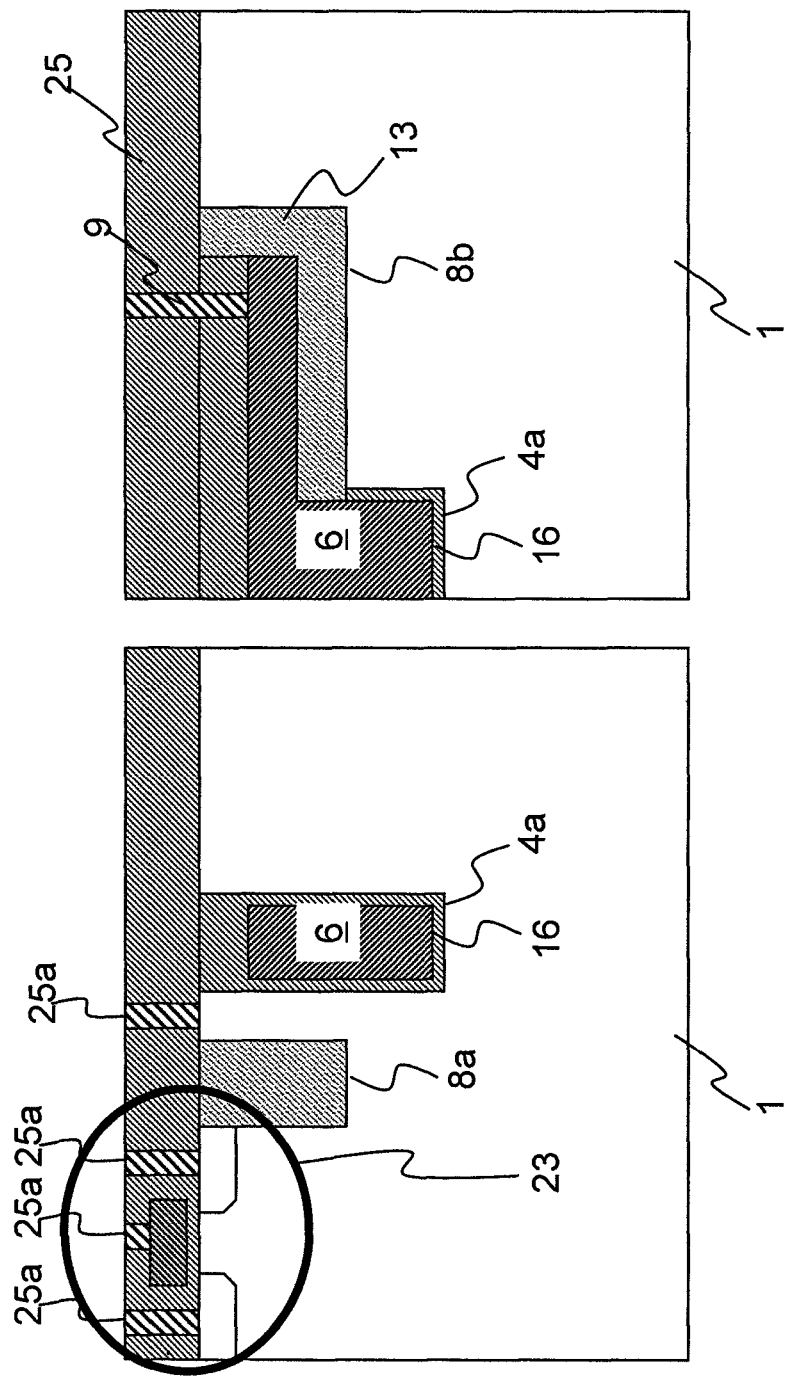
FIG. 11 is a cross-sectional view illustrating one step of a method for manufacturing the semiconductor device according to the first exemplary embodiment.

Next, as illustrated in FIG. 11, silicon oxide film 25 having a thickness of 200 nm is formed on the entire surface of semiconductor substrate 1 as an interlayer insulating film. Thereafter, contact holes are formed so as to penetrate through interlayer insulating film 25 and expose gate electrode 21 and diffusion layers 22 of the MOS transistor, a part of silicon substrate 1, and trench-type electrode 6 positioned in the second portions 8b. Thereafter, titanium nitride film having a thickness of 5 nm and tungsten film having a thickness of 50 nm are sequentially deposited. Then, these films are planarized by CMP to form contact plugs 9 and 25a in the contact holes.

Figure 12:
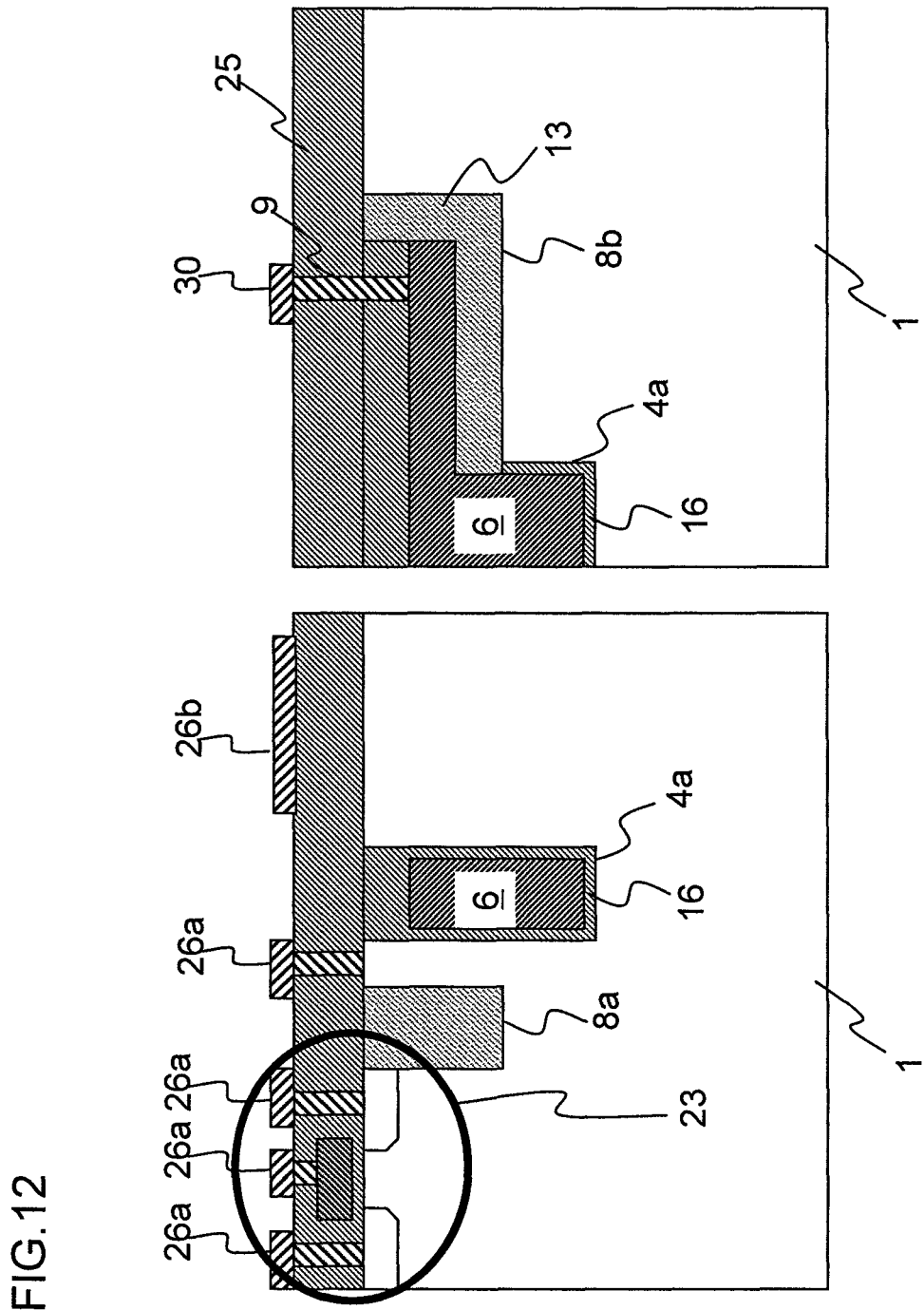
FIG. 12 is a cross-sectional view illustrating one step of a method for manufacturing the semiconductor device according to the first exemplary embodiment.

Next, as illustrated in FIG. 12, wirings 30 and 26a are formed so as to be connected to contact plugs 9 and 25a, respectively. At the same time as this formation, electrode 26b is formed in a position in which buried electrode plug 3 is to be formed in a later step.

Figure 13:
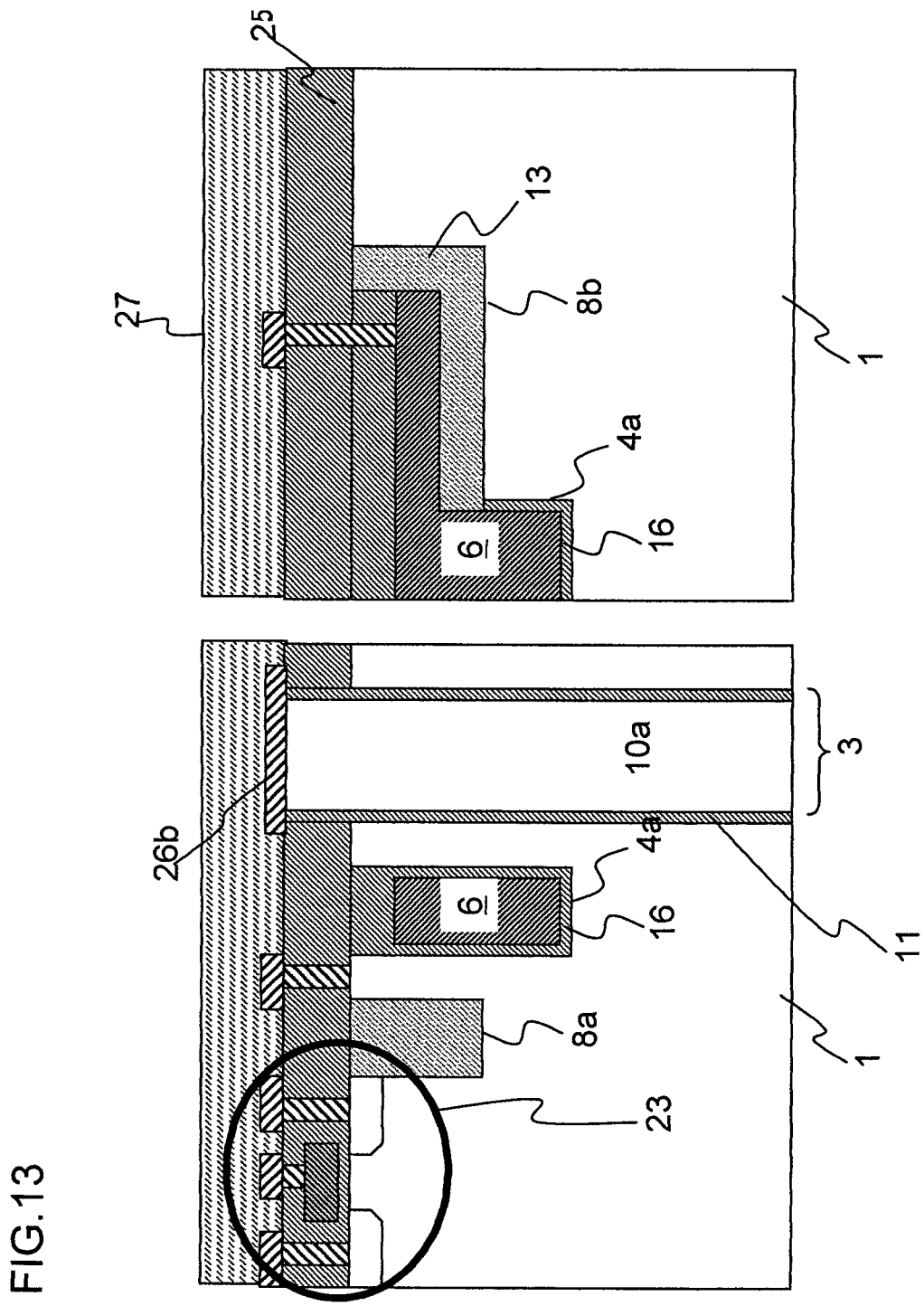
FIG. 13 is a cross-sectional view illustrating one step of a method for manufacturing the semiconductor device according to the first exemplary embodiment.

Next, as illustrated in FIG. 13, passivation film 27 for surface protection is formed on the entire surface of interlayer insulating film 25. Thereafter, silicon substrate 1 is ground from the rear surface side thereof, so as to thin silicon substrate 1 down to 50 μm in thickness. Next, hole 10a for buried electrode plug 3 is formed until electrode 26b is exposed out of the ground rear surface of silicon substrate 1. Insulating film 11 made of a silicon nitride film is formed on the sidewall of hole 10a.

Figure 14:
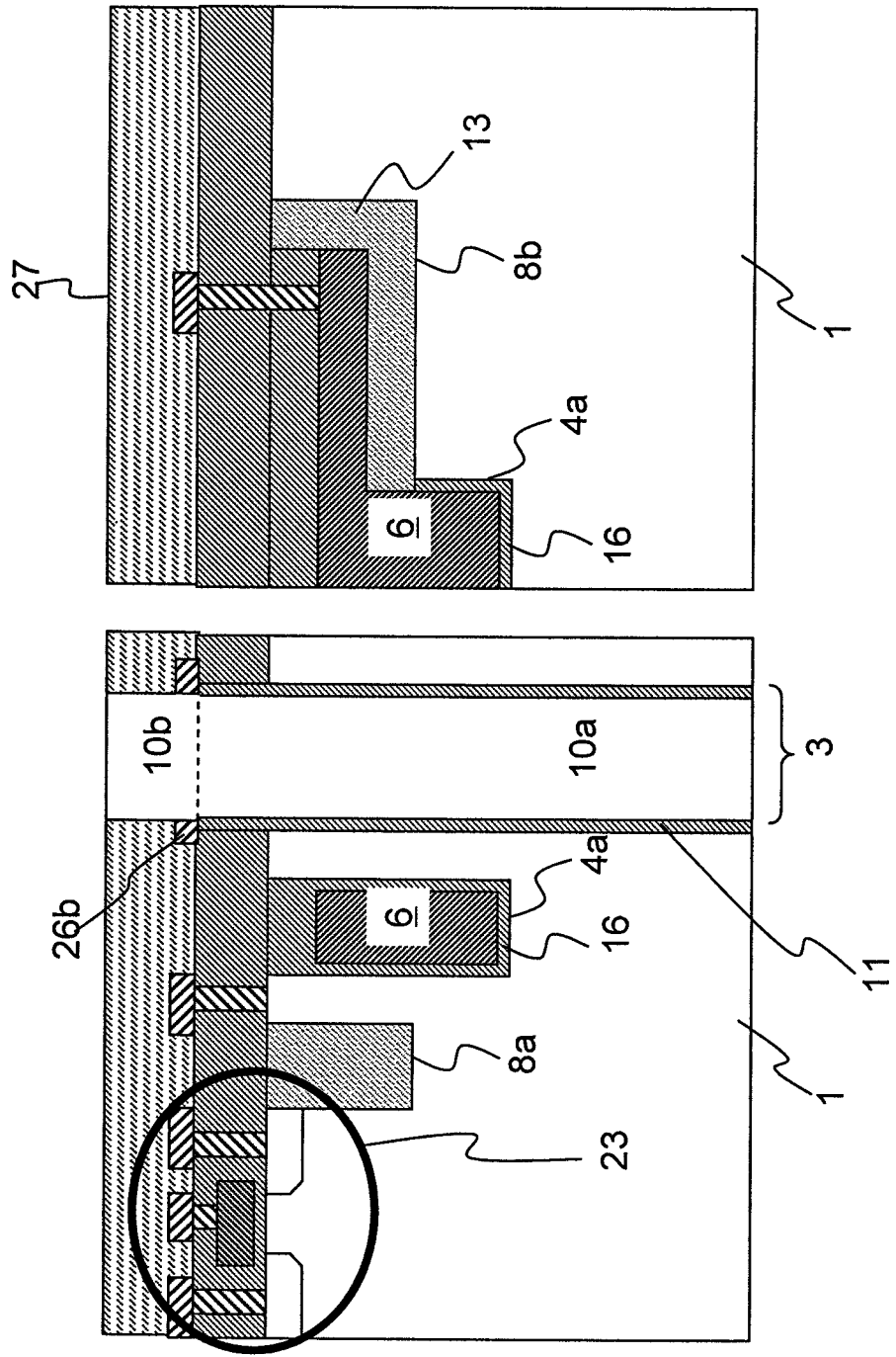
FIG. 14 is a cross-sectional view illustrating one step of a method for manufacturing the semiconductor device according to the first exemplary embodiment.

Next, as illustrated in FIG. 14, electrode 26b and passivation film 27 are etched using silicon nitride film 11 as an etching mask, to form a hole 10b which penetrates through electrode 26b and passivation film 27.

Figure 15:
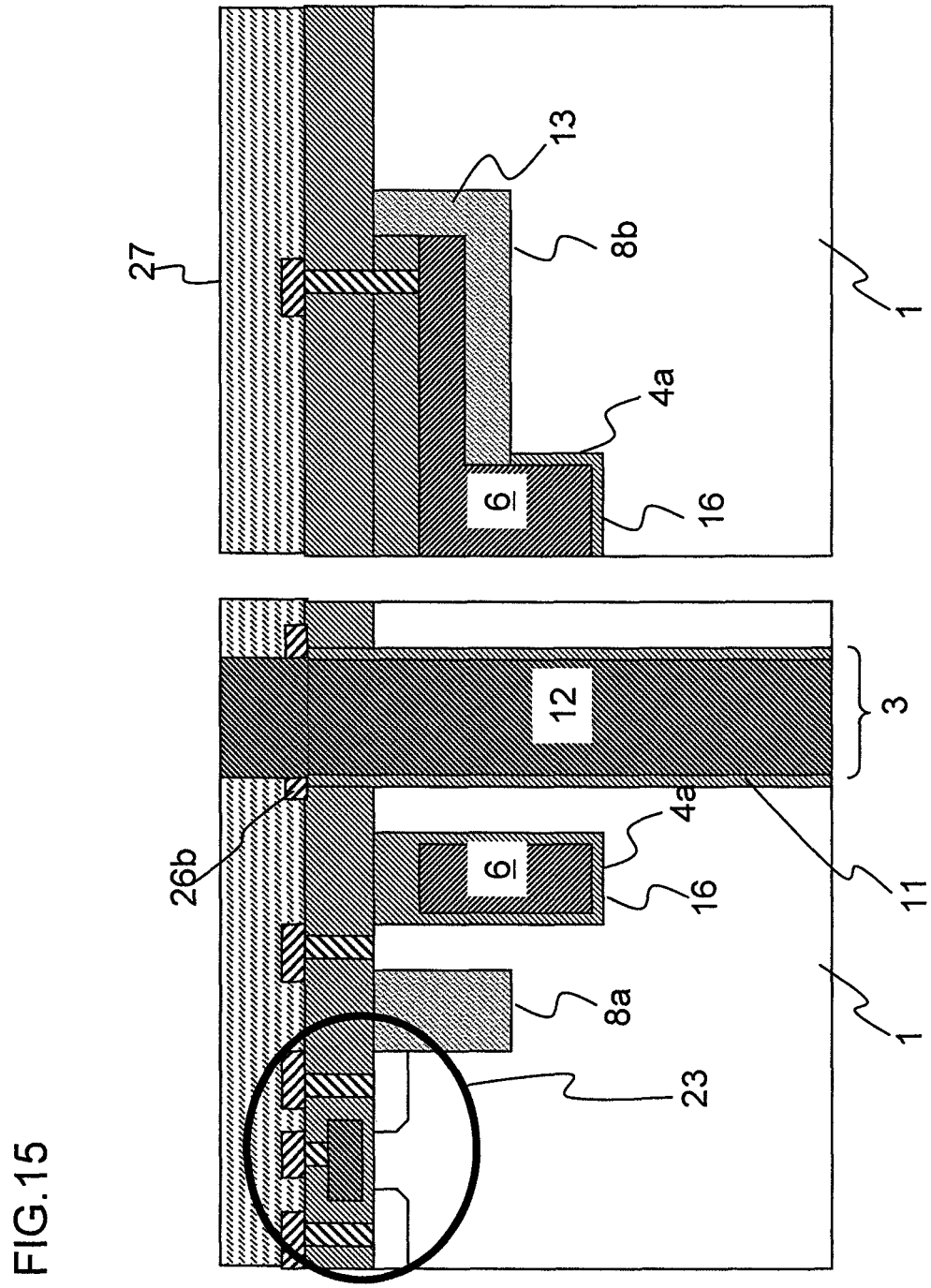
FIG. 15 is a cross-sectional view illustrating one step of a method for manufacturing the semiconductor device according to the first exemplary embodiment.

Next, as illustrated in FIG. 15, copper is buried in holes 10a and 10b. Thereafter, the rear surface of copper film is planarized to form through-hole electrode 12, thereby completing buried electrode plug 3.

As described above, there is formed a semiconductor chip including a semiconductor substrate 1, an element-forming region 2, buried electrode plugs 3, and trench-type electrodes 6. Thereafter, bumps (not illustrated) are formed on the upper and lower surfaces of each buried electrode plug 3 of the semiconductor chip. Next, buried electrode plugs 3 of each semiconductor chip are aligned with one another and then semiconductor chips are stacked and a reflow treatment is performed. Consequently, the semiconductor device according to the present exemplary embodiment is completed.

Each buried electrode plug 3 is comparatively larger in volume than element-forming region 2. Consequently, the mechanical stress of a material used for the buried electrode plug 3 becomes also larger and transmits to the element-forming region 2 of the semiconductor substrate 1, thus causing a distortion in the crystal lattice of a semiconductor. In the present exemplary embodiment, stress generated by the buried electrode plug 3 is absorbed at this time by the trench-type electrode 6 as the result of arranging the trench-type electrode 6. Consequently, the crystal lattice distortion only arises between the trench-type electrode 6 and the buried electrode plug 3, and does not occur in the element-forming region 2. As a result, stress due to the crystal lattice distortion does not arise in the element-forming region 2. Thus, it is possible to prevent property fluctuations in the semiconductor device.

In addition, capacitive coupling through an insulating film (capacitive film) around the buried electrode plug 3 occurs due to the potential variation of the buried electrode plug 3. Thus, the potential of the semiconductor substrate 1 varies (generation of electrical noise). At this time, in the present exemplary embodiment, it is possible to keep stable the potential of the semiconductor substrate 1 in the vicinity of the trench-type electrode 6 by fixing the potential of the trench-type electrode 6. As a result, the potential variation of the semiconductor substrate 1 can be confined only to the vicinity of the trench-type electrode 6. Consequently, it is possible to prevent the operational destabilization of the semiconductor device due to the transmission of electrical noise from the buried electrode plug 3.

Second Exemplary Embodiment

The present exemplary embodiment corresponds to a modified example of the first exemplary embodiment. The present exemplary embodiment differs from the first exemplary embodiment in that in each semiconductor substrate 1, a plurality of trench-type electrodes 6a and 6b segmentalized from each other or one another are formed between element-forming region 2 and buried electrode plugs 3.

Figure 16:
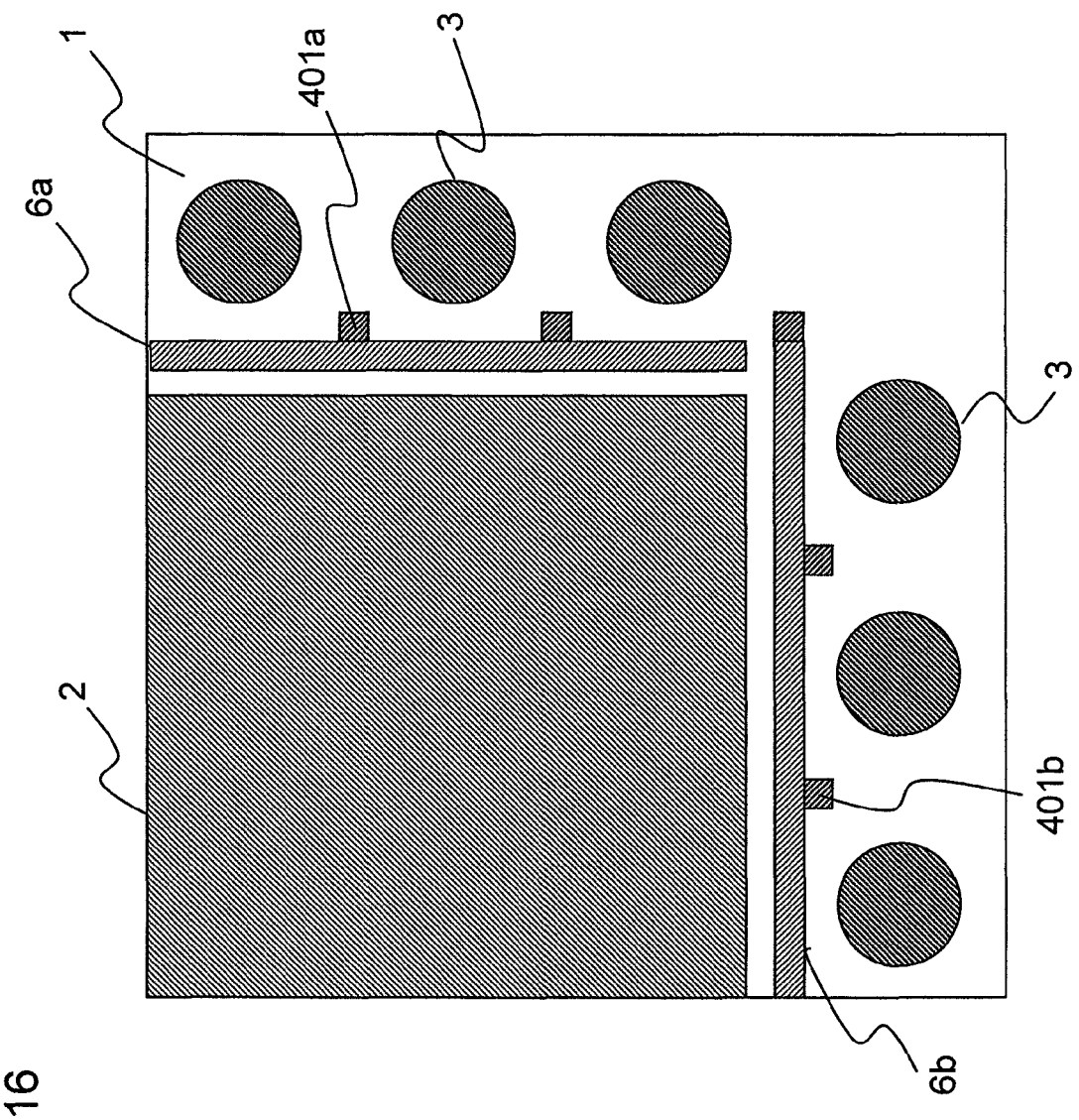
FIG. 16 is a top view illustrating a semiconductor device according to a second exemplary embodiment.

FIG. 16 is a schematic view representing a semiconductor device according to the second exemplary embodiment. As illustrated in FIG. 16, a trench-type electrode need not necessarily be continuously formed so as to surround element-forming region 2. Alternatively, the trench-type electrode may be formed of a plurality of trench-type electrodes 6a and 6b segmentalized from each other. In this case, contact plugs (not illustrated) are formed in contact-forming regions 401a and 401b, so that independent potentials are applied to trench-type electrodes 6a and 6b, respectively. As a result, a ground potential can be applied to trench-type electrode 6a, and a power supply potential can be applied to trench-type electrode 6b formed in an n-type well region. Depending on circumstances, a negative potential may be applied to trench-type electrode 6a formed in a p-type well region, and a potential higher toward the positive polarity side than the power supply potential may be applied to trench-type electrode 6b formed in the n-type well region. As described above, in the present exemplary embodiment, potentials for trench-type electrodes 6a and 6b can be selected depending on the conductivity type of each well region. Thus, it is possible to effectively prevent effects of electrical noise on the semiconductor device. The number of trench-type electrodes may be changed as appropriate.

Third Exemplary Embodiment

The present exemplary embodiment corresponds to a modified example of the first exemplary embodiment. The present exemplary embodiment differs from the first exemplary embodiment in that in each semiconductor substrate 1, two trench-type electrodes 6a and 6b are formed so as to surround the element-forming region 2 between the element-forming region 2 and the buried electrode plugs 3.

Figure 17:
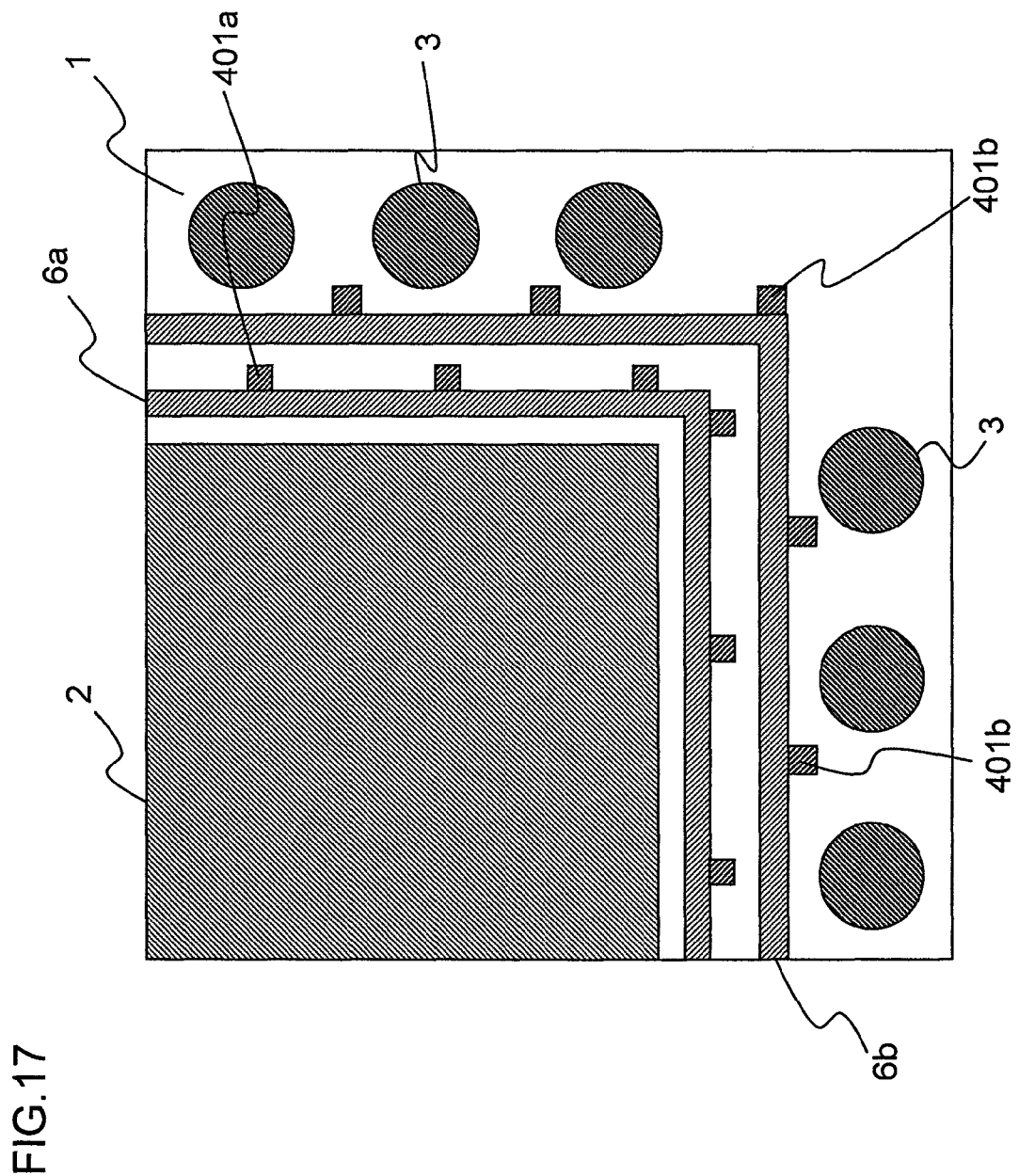
FIG. 17 is a top view illustrating a semiconductor device according to a third exemplary embodiment.

FIG. 17 is a schematic view representing a semiconductor device according to the third exemplary embodiment. As in the case of the second exemplary embodiment, contact plugs (not illustrated) can be formed in contact-forming regions 401a and 401b so that independent potentials are applied to trench-type electrodes 6a and 6b, respectively.

In the present exemplary embodiment, two trench-type electrodes 6a and 6b are provided so as to surround the element-forming region 2. Accordingly, stress propagation to the element-forming region 2 by the buried electrode plugs 3 and the potential variation of the semiconductor substrate 1 can be inhibited more effectively in the present exemplary embodiment than in the first exemplary embodiment. The number of trench-type electrodes may be changed as appropriate.

Fourth Exemplary Embodiment

The present exemplary embodiment corresponds to a modified example of the first exemplary embodiment. The present exemplary embodiment differs from the first exemplary embodiment in that in each semiconductor substrate 1, trench-type electrodes 6a and 6b are formed so as to surround the buried electrode plugs 3.

Figure 18:
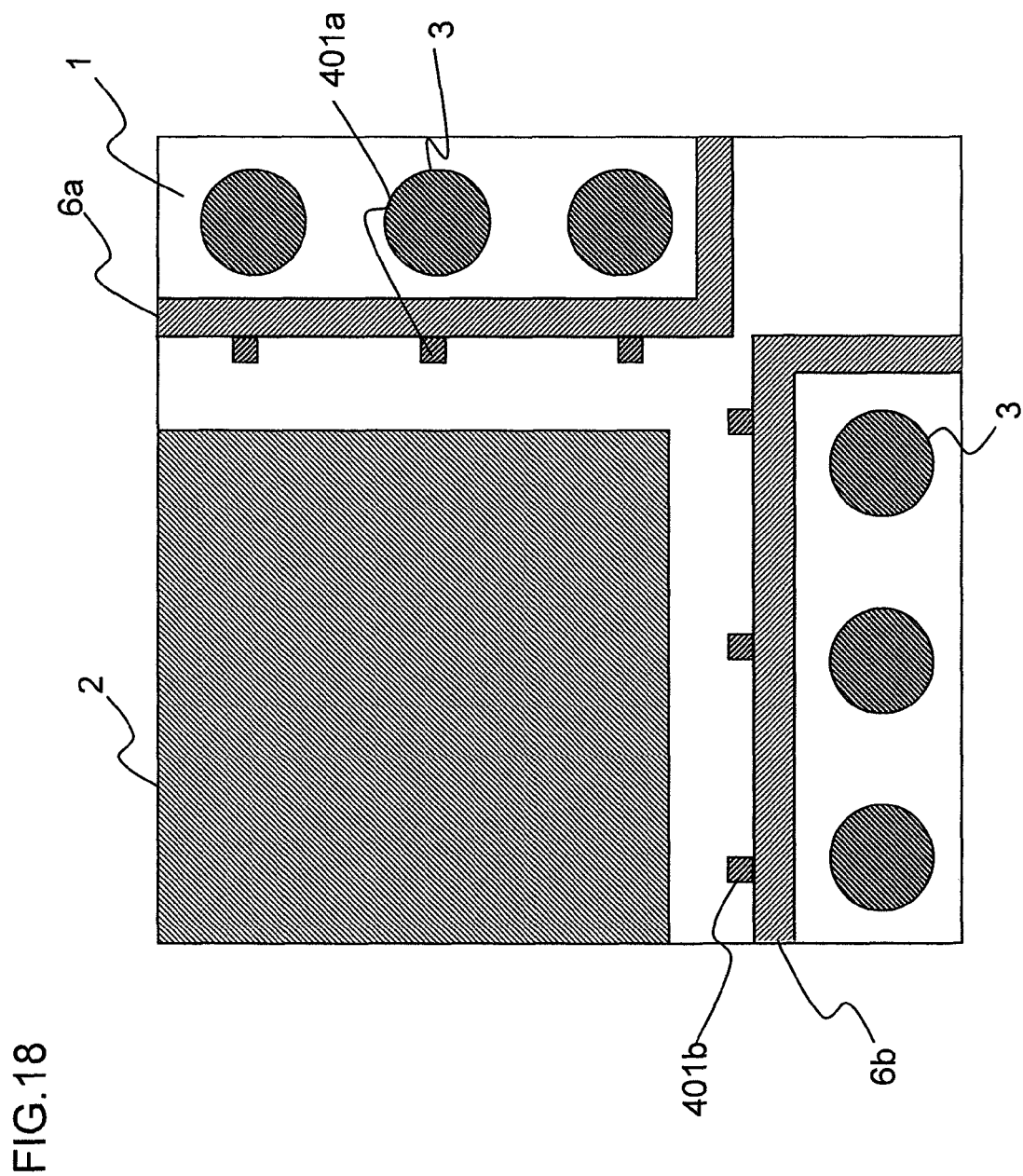
FIG. 18 is a top view illustrating a semiconductor device according to a fourth exemplary embodiment.

FIG. 18 is a schematic view representing a semiconductor device according to the fourth exemplary embodiment. FIG. 18 illustrates an example in which two trench-type electrodes 6a and 6b are formed so as to surround a plurality of buried electrode plugs 3.

As in the case of the second exemplary embodiment, contact plugs (not illustrated) can be formed in contact-forming regions 401a and 401b so that independent potentials are applied to trench-type electrodes 6a and 6b, respectively. The number of buried electrode plugs surrounded by trench-type electrodes and the number of trench-type electrodes may be changed as appropriate.

A device in which all or some of semiconductor chips described in the first to fourth exemplary embodiments are stacked may also be used.

It is apparent that the present invention is not limited to the above embodiments, but may be modified and changed without departing from the scope and spirit of the invention.

What is claimed is:

1. A semiconductor device, comprising:
a semiconductor substrate;
an element-forming region including a semiconductor element formed on the semiconductor substrate;
a buried electrode plug formed so as to penetrate through the semiconductor substrate; and
a trench-type electrode buried in a trench within the semiconductor substrate positioned between the element-forming region and the buried electrode plug,
wherein the element-forming region comprises:
an active region defined by an isolation region; and
a MOS transistor including the active region, and
wherein the trench comprises:
a first portion deeper than the isolation region; and
a second portion having the same depth as depth of the isolation region and communicating with the first portion.

2. The semiconductor device according to claim 1,
wherein the trench is positioned so as to surround the element-forming region.

3. The semiconductor device according to claim 2, further comprising an additional trench surrounding the trench within the semiconductor substrate.

4. The semiconductor device according to claim 1, further comprising an additional trench within the semiconductor substrate, each of the additional trench and the trench located between the element-forming region and the buried electrode plug.

5. The semiconductor device according to claim 1,
wherein the trench is positioned so as to surround the buried electrode plug.

6. The semiconductor device according to claim 1,
wherein the trench-type electrode is continuously provided in the first and second portions of the trench,
the semiconductor device further comprises a contact plug connected to the trench-type electrode positioned in the second portion, and
a potential is applicable to the contact plug.

7. The semiconductor device according to claim 6,
wherein the trench-type electrode positioned in the second portion is shallower than the isolation region.

8. A semiconductor device comprising a plurality of semiconductor chips,
wherein each semiconductor chip comprises:
a semiconductor substrate;
an element-forming region including a semiconductor element formed on the semiconductor substrate;
a buried electrode plug formed so as to penetrate through the semiconductor substrate; and
a trench-type electrode buried in a trench within the semiconductor substrate positioned between the element-forming region and the buried electrode plug,
wherein the semiconductor chips are connected to each other through the buried electrode plugs,
wherein the element-forming region comprises:
an active region defined by an isolation region; and
a MOS transistor including the active region, and
wherein the trench comprises:
a first portion deeper than the isolation region; and
a second portion having the same depth as depth of the isolation region and communicating with the first portion.

9. The semiconductor device according to claim 8,
wherein the trench of each semiconductor chip is positioned so as to surround the element-forming region.

10. The semiconductor device according to claim 9,
wherein a plurality of the trenches are positioned so as to surround the element-forming region in each semiconductor chip.

11. The semiconductor device according to claim 8,
wherein a plurality of the trenches segmentalized from each other are positioned between the element-forming region and the buried electrode plug in each semiconductor chip.

12. The semiconductor device according to claim 8,
wherein the trench of each semiconductor chip is positioned so as to surround the buried electrode plug.

13. The semiconductor device according to claim 8,
wherein the trench-type electrode is continuously provided in the first and second portions of the trench,
the semiconductor device further comprises a contact plug connected to the trench-type electrode positioned in the second portion, and
a potential is applicable to the contact plug.

14. The semiconductor device according to claim 13,
wherein the trench-type electrode positioned in the second portion is shallower than the isolation region.

15. A semiconductor device, comprising:
a semiconductor substrate having a trench;
an element-forming region including a semiconductor element on the semiconductor substrate;
an isolation region included in the element-forming region;
an active region surrounded with the isolation region;
a field effect transistor included in the active region;
a buried electrode plug penetrating through the semiconductor substrate;
a trench-shape electrode buried in the trench and located between the element-forming region and the buried electrode plug; and
first and second portions included in the trench-shape electrode and extending each other continuously, the first portion extending below a bottom of the isolation region, the second portion positioned above the bottom of the isolation region.

16. The semiconductor device according to claim 15,
wherein the trench-shape electrode surrounds the element-forming region.

17. The semiconductor device according to claim 16,
further comprising an additional trench-shape electrode surrounding the trench-shape electrode in the semiconductor substrate.

18. The semiconductor device according to claim 15, further comprising an additional trench-shape electrode, each of the additional trench-shape electrode and the trench-shape electrode located between the element-forming region and the buried electrode plug.

19. The semiconductor device according to claim 15, wherein the trench-shape electrode surrounds the buried electrode plug.

20. The semiconductor device according to claim 15, further comprising:
   a contact plug connected to the second portion of the trench-shape electrode; and
   a wiring connected to the contact plug.

* * * * *